United States Patent [19]
Porst et al.

[11] 4,096,623
[45] Jun. 27, 1978

[54] THYRISTOR AND METHOD OF PRODUCING THE SAME

[75] Inventors: Alfred Porst; Gottfried Schuh, both of Munich, Germany

[73] Assignee: Siemens Aktiengesellschaft, Berlin & Munich, Germany

[21] Appl. No.: 760,272

[22] Filed: Jan. 18, 1977

Related U.S. Application Data

[62] Division of Ser. No. 590,706, Jun. 26, 1975, abandoned.

[30] Foreign Application Priority Data

Jul. 1, 1974 Germany ............................ 2431506

[51] Int. Cl.² ............................................. H01L 33/00
[52] U.S. Cl. ..................................... 29/580; 156/656; 156/661; 357/38
[58] Field of Search ................... 29/580, 591; 357/38, 357/68; 156/656, 657, 661

[56] References Cited

U.S. PATENT DOCUMENTS

| | | | |
|---|---|---|---|
| 3,619,738 | 11/1971 | Otsuka ................................. | 357/68 |
| 3,694,708 | 9/1972 | Arlt et al. ............................ | 357/68 |
| 3,945,347 | 3/1976 | Takemoto et al. ................ | 29/591 X |
| 3,961,414 | 6/1976 | Humphreys ...................... | 29/591 X |
| 3,964,155 | 6/1976 | Leinkram et al. ................ | 29/591 X |

*Primary Examiner*—Roy Lake
*Assistant Examiner*—Howard N. Goldberg
*Attorney, Agent, or Firm*—Hill, Gross, Simpson, Van Santen, Steadman, Chiara & Simpson

[57] ABSTRACT

A thyristor having current-amplifying auxiliary structures with an auxiliary emitter electrode out of contact with the contact electrode. The auxiliary emitter electrode is formed thinner than the main emitter electrode. The contact electrode is formed by simple planar techniques to have a plane surface on top of the semiconductor body.

5 Claims, 14 Drawing Figures

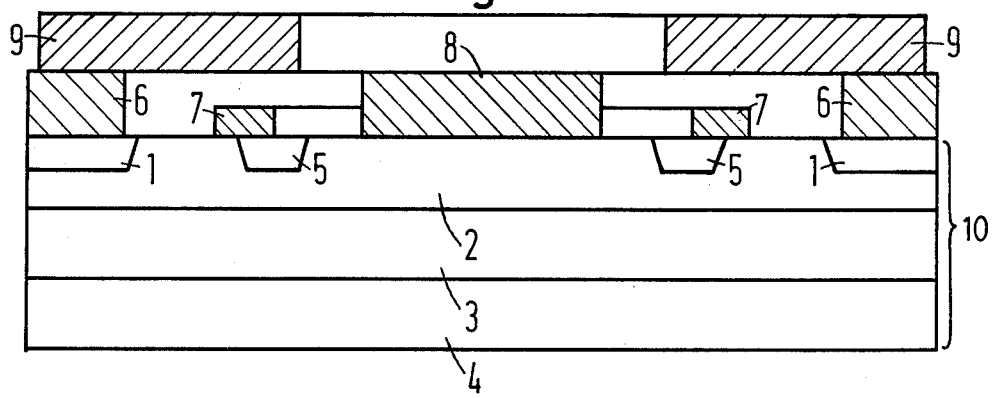
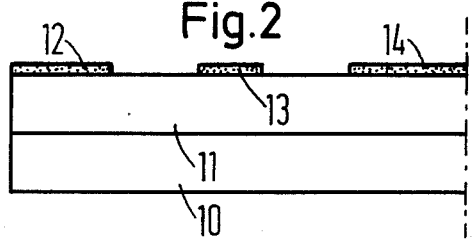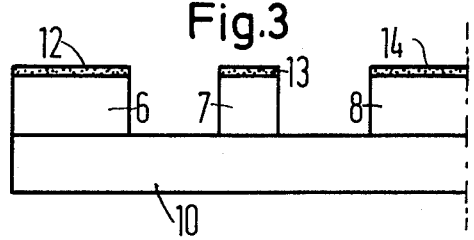
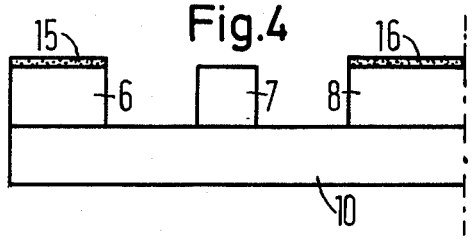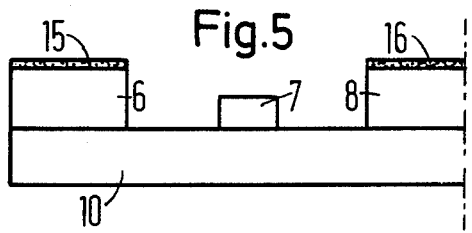
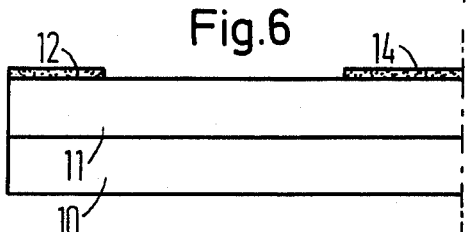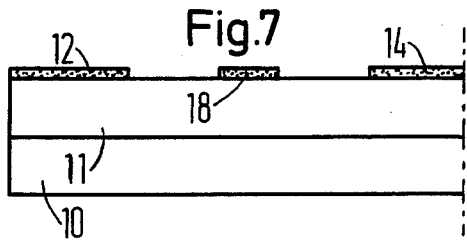
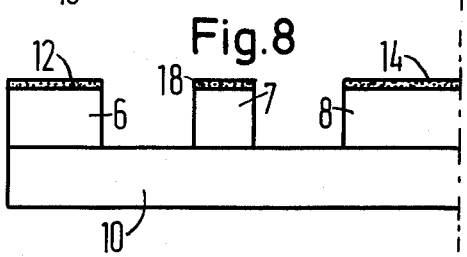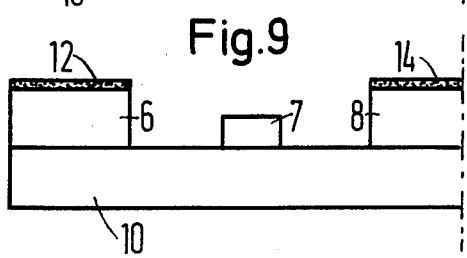

THYRISTOR AND METHOD OF PRODUCING THE SAME

This is a division, of application Ser. No. 590,706, filed June 26, 1975, now abandoned.

BACKGROUND OF THE INVENTION

1. Field of the Invention

The invention relates to thyristors and somewhat more particularly to thyristors having a semiconductor body with an emitter zone at least partially covered by an emitter electrode, a base zone situated beneath the emitter zone and accessible at the surface of the semiconductor body so as to be connected with a control electrode and a contact electrode which lies on the emitter electrode and has a plane or level face above the semiconductor body, along with an auxiliary emitter zone arranged between the control electrode and the emitter electrode and which is connected to an auxiliary emitter electrode as well as to a method of producing such thyristor structures.

2. Prior Art

An auxiliary emitter zone within a thyristor structure in combination with other zones therein amplifies a control current fed to the semiconductor body thereof via a control electrode. The control current flows across the control electrode into the base zone of the semiconductor body and from there to the auxiliary emitter zone. This auxiliary emitter zone discharges charge carriers into the base zone, and as a result thereof, the control current is amplified through a known feedback mechanism in a four-layer thyristor structure and travels across the base zone as an amplified control current to the emitter zone of such a thyristor.

Thyristors are generally traversed by high currents and are therefore provided with a large-area contact electrode which is positioned on the emitter electrode. In order for the current-amplifying auxiliary emitter zone to properly function, it must remain out of contact with the contact electrode. Heretofore, suggestions have been made to position the auxiliary emitter electrode as well as the auxiliary emitter zone into a pit or well within the semiconductor body so that the side of the contact electrode resting on the semiconductor body can be formed level or plane. Such prior art suggestions cause extreme complications in the fabrication of such structures since it is first necessary to produce a pit or window within the semiconductor body and then to metallize the base or bottom of this window.

SUMMARY OF THE INVENTION

The invention provides a thyristor having an auxiliary emitter electrode out of contact with the contact electrode and a simplified procedure for producing such a thyristor which avoids the heretofore noted prior art drawbacks.

In accordance with the principles of the invention, the auxiliary emitter electrode is made thinner than the emitter electrode so that its upper surface is at a lower level than that of the upper surface of the emitter electrode and the contact electrode is provided with a flat or plane face along the entire surface thereof facing the semiconductor body and in contact with only the upper surface of the emitter electrode.

In one embodiment of the invention, a suitable semiconductor body having various conductive zones therein is coated with a metal layer having a desired thickness for the emitter electrode, the metal layer is then suitably masked and etched in a pattern to form the emitter electrode, the control electrode and the auxiliary emitter electrode and the metal layer area corresponds to that of the auxiliary emitter electrode is then unmasked and further etched to provide a desired difference in thickness between the emitter and control electrodes and the auxiliary emitter electrode. Thereafter, the emitter and control electrodes are unmasked and the thyristor structure is completed, as by providing a suitable contact electrode onto the surface of the emitter electrode.

In another embodiment of the invention, a metal layer is applied onto a surface of a suitable semiconductor body in a desired thickness, a first pattern having protected areas suitable for producing the emitter electrode and the control electrode is applied onto the metal layer via a photo-mask composed of a first photo-sensitive lacquer or resist, a second pattern having a protected area suitable for producing the auxiliary emitter electrode is applied onto the metal layer via a photo-mask composed of a second photo-sensitive lacquer which is soluble (after exposure) in a solvent that does not attack or dissolve the first photo-sensitive lacquer, the uncoated regions of the metal layer are etched down to the surface of the semiconductor body, then the second pattern is removed and the so-uncovered metal layer area which corresponds to the auxiliary emitter electrode is then etched to a desired thickness. Thereafter, the first pattern is removed and a thyristor structure is completed as desired.

In yet another embodiment of the invention, a metal layer of a thickness sufficient for the emitter electrode is deposited onto a plane surface of a suitable semiconductor body, a first photo-mask having an open area corresponding to the shape of an auxiliary emitter electrode is applied onto the metal layer and a window or pit of a suitable depth is etched through the photo-mask into the metal layer so that the base or bottom of the pit is above the surface of the semiconductor body and below the surface of the masked metal layer, the first photo-mask is then removed and a second photo-mask having protected areas corresponding to the emitter electrode, the control electrode and the base or bottom of the just-produced window or pit is applied onto the metal layer and the uncoated metal layer areas between the pit and the emitter and control electrodes respectively are etched down to the surface of the semiconductor body. Thereafter, the second photo-mask is removed and the thyristor structure is completed as desired.

BRIEF DESCRIPTION OF THE DRAWINGS

FIG. 1 is an elevated partial sectional view through a semiconductor body of a thyristor having a contact electrode and constructed in accordance with the principles of the invention;

FIGS. 2–5 are schematic partial views of a thyristor undergoing production in accordance with an embodiment of the invention;

FIGS. 6–10 are schematic partial views of a thyristor undergoing production in accordance with another embodiment of the invention.

DESCRIPTION OF THE PREFERRED EMBODIMENTS

Figure 10:
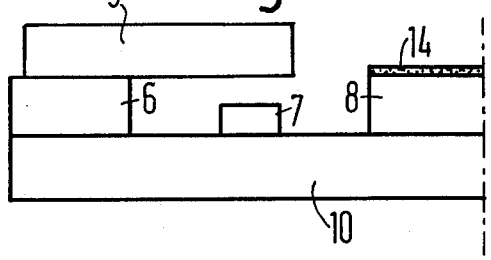
Figure 11:
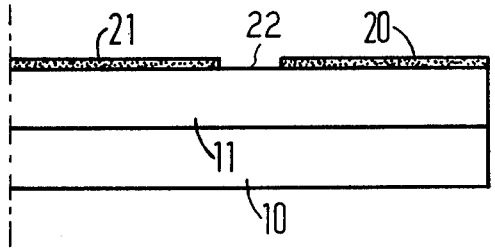
FIGS. 11–14 are somewhat similar schematic partial views of a thyristor undergoing production in accordance with yet another embodiment of the invention.

FIG. 1 shows a typical thyristor structure comprised of a semiconductor body having five elctrical zones or regions therein. Generally, the semiconductor body includes an emitter zone 1, a base zone 2, two other zones 3 and 4 and an auxiliary emitter zone 5. The emitter zone 1 is at least partially covered with an emitter electrode 6 and the auxiliary emitter zone 5 is electrically connected with an auxiliary emitter electrode 7 while the base zone 2 is electrically connected with a contact electrode 8. The auxiliary emitter electrode 7 is also connected to the base zone 2 along the face thereof adjacent the emitter zone 1. A contact electrode 9 is arranged on the semiconductor element so as to be in contact with only the emitter electrode 6. Contact between the contact electrode 9 and the auxiliary emitter electrode 7 is avoided because, as shown, the auxiliary emitter electrode 7 is made thinner than the emitter electrode 6 so that the upper surface of the auxiliary emitter electrode lies below the upper surface of the emitter electrode 6 on which the contact electrode rests. The respective lower surfaces of the auxiliary emitter electrode and the emitter electrode are on the same plane and on an identical surface of the semiconductor body. Typically, the auxiliary emitter electrode 7 is about 15μm thick while the emitter electrode 6 is about 30μm. Although a 1:2 thickness ratio is suitable, the thickness ratio of the auxiliary emitter electrode to that of the emitter electrode may range from about 1:4 to 1:1.5.

A desired thickness of the auxiliary emitter electrode in relation to the thickness of the emitter electrode may be achieved by etching with known metal etchants with the aid of known photo-masking techniques.

Figure 12:
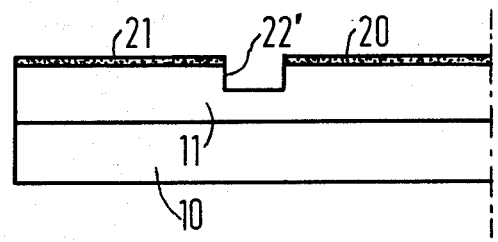
Figure 13:
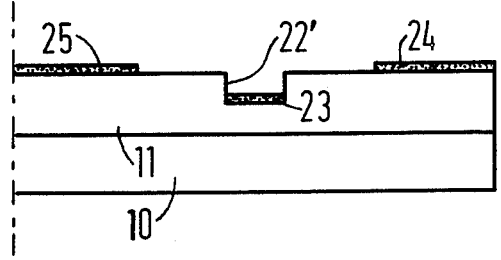
Figure 14:
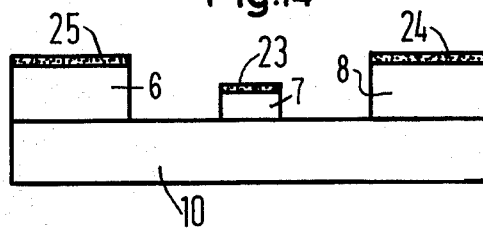

Three particularly preferred and simple procedures for producing such emitter electrodes and auxiliary emitter electrode structures are illustrated in FIGS. 12-14 wherein corresponding elements have identical reference numerals. Throughout FIGS. 2-14, a semiconductor body having a plurality of electrically conductive zones, such as zones 1-5 shown at FIG. 1, is illustrated in simplified form as element 10.

Referring first to the process illustrated at FIGS. 2-5, a suitable semiconductor body 10 having an upper plane surface and including an emitter zone, a base zone and an auxiliary emitter zone is first provided with a uniform metal layer 11, which may, for example, be composed of aluminum, a silver-plated aluminum or some other compatible metal. The metal layer 11 is deposited in a thickness sufficient for emitter electrodes and may, typically, be of a thickness of about 30μm. Next, by known technology with the use of a first photo-masking step, a protective layer comprised of photo-sensitive lacquer areas 12, 13 and 14 is produced on the metal layer as shown in FIG. 2. The lacquer area 12 corresponds to the desired shape of the emitter electrode 6, the shape of the lacquer area 13 corresponds to the desired shape of the auxiliary emitter electrode 7 and the shape of the lacquer area 14 corresponds to that of the control electrode 8. Thereafter, the uncoated metal layer areas between the lacquer areas 12, 13 and 14 are etched away with a suitable etchant down to the surface of the semiconductor body as shown in FIG. 3. Then, the lacquer areas 12, 13 and 14 are removed via a suitable solvent or developer therefor and lacquer areas 15 and 16 are applied onto metal layer areas corresponding to the electrodes 6 and 8 via a second photo-masking step, such as shown at FIG. 4. Next, the metal layer area corresponding to the auxiliary emitter electrode 7 is etched away with a suitable etchant to a desired thickness, for example, 15μm, such as shown at FIG. 5. Following the removal of the lacquer areas 15 and 16, the contact electrode 9 may be positioned on the emitter electrode 6 and the structure completed as desired.

The process illustrated at FIGS. 6-10 differs from that described in conjunction with FIGS. 2-5 in that the lacquer area provided for forming the auxiliary emitter electrode 7 from the metal layer 11 is composed of a photo-lacquer whose solvent does not attack or dissolve the lacquer areas provided for forming the emitter electrode 6 and the control 8. Thus, as shown at FIG. 5, a first pattern of a photo-sensitive lacquer having protected lacquer areas 12 and 14 which respectively correspond to a desired shape of the emitter electrode 6 and the contact electrode 8 is provided and then, as shown at FIG. 7, a second pattern having a protected lacquer layer 18 corresponding to the shape of the auxiliary emitter electrode 7 is provided onto the metal layer 11. For example, the protected lacquer areas 12 and 14 may be composed of a commercially available photo-sensitive negative lacquer, such as available under the trade designation KMER and produced by Kodak, which is soluble in known lacquer strippers or developer. On the other hand, the protected lacquer area 18 may be composed of a commercially available photo-sensitive positive lacquer, such as available under the trade designation AZ 1350H and produced by Shipley, which is soluble in solvents that does not attack negative lacquers, such as acetone. After the application of the lacquer layers 12, 14 and 18, the metal layer areas between such lacquer layer areas are etched away down to the surface of the semiconductor body 10, such as shown at FIG. 8. Thereafter, the lacquer layer 18 is removed via a suitable solvent which does not affect lacquer layers 12 and 14, respectively, and the so-uncovered metal layer area is etched to a suitable height, for example, 15μm, such as shown at FIG. 9 to form the auxiliary emitter electrode 7. Then, the lacquer layer 12 is removed and a contact electrode 9 is positioned on the emitter electrode 6 and out of contact with the auxiliary emitter electrode 7, such as shown at FIG. 10. Lastly, the lacquer layer 14 is removed and the structure is completed as desired.

In the process illustrated at FIGS. 11-14, the metal layer 11 is covered with a photo-mask having lacquer areas 20 and 21 so as to leave uncovered between such lacquer layers a zone 22 which corresponds to a desired shape of the auxiliary emitter electrode 7. Then, using a suitable metal etchant, for example, a mixture of phosphoric acid and acidic acid, a window or pit 22' is etched through the zone 22 into the metal layer 11 to such a depth that the metal layer remaining below the base or bottom of the pit corresponds to the desired thickness of the auxiliary emitter electrode. Next, the photo-mask with protective areas 20 and 21 is removed and a second photo-mask having protective lacquer areas 23, 24 and 25 is applied. Lacquer area 23 covers the bottom of the pit 22' and lacquer areas 24 and 25, respectively, correspond to the desired shape of the emitter and control electrodes, respectively. Thereafter, the uncovered metal layer areas between the lacquer areas 23, 24 and 25, respectively, are etched away down to the surface of the semiconductor body 10, as shown at FIG. 14. Thereafter, the lacquer areas 23, 24 and 25 are removed and the structure is completed as desired, for example, by positioning a contact electrode 9 onto the emitter electrode 6.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A process for producing a thyristor structure having a semiconductor body which includes a plane surface, an emitter zone at least partially covered by an emitter electrode, a base zone located adjacent said emitter zone and accessible at said plane surface of the semiconductor body, a control electrode having a plane surface in contact with said base zone, a contact electrode positioned on said emitter electrode and having a plane face above said plane surface of the semiconductor body and an auxiliary emitter zone positioned between said emitter zone and said control electrode and accessible at said plane surface of the semiconductor body, said auxiliary emitter zone having an auxiliary emitter electrode in contact therewith, the steps comprising:

providing a semiconductor body having at least a plane upper surface, an emitter zone, a base zone and an auxiliary emitter zone therein which are spaced from one another and accessible at said plane upper surface of the semiconductor body;

depositing a metal layer on said plane surface of the semiconductor body in a thickness corresponding to a desired height dimension of an emitter electrode;

masking areas of said metal layer at least partially above said zones in a pattern corresponding to a desired shape of an emitter electrode, a control electrode and an auxiliary emitter electrode with a first photo-mask;

etching uncoated metal layer areas down to said surface of the semiconductor body and thereafter removing said first photo-mask;

masking areas of the resultant metal layer at least partially above the emitter and base zones with a second photo-mask;

etching the uncoated metal layer area above the auxiliary emitter zone to a height less than the masked metal layer areas and thereafter removing said second photo-mask; and completing said thyristor structure.

2. A process for producing a thyristor structure having a semiconductor body which includes a plane surface, an emitter zone at least partially covered by an emitter electrode, a base zone located adjacent said emitter zone and accessible at said plane surface of the semiconductor body, a control electrode having a plane surface in contact with said base zone, a contact electrode positioned on said emitter electrode and having a plane face above said plane surface of the semiconductor body and an auxiliary emitter zone positioned between said emitter zone and said control electrode and accessible at said plane surface of the semiconductor body, said auxiliary emitter zone having an auxiliary emitter electrode in contact therewith, the steps comprising:

providing a semiconductor body having at least a plane upper surface, an emitter zone, a base zone and an auxiliary emitter zone therein which are spaced from one another and accessible at said plane upper surface of the semiconductor body;

depositing a metal layer on said plane surface of the semiconductor body in a thickness corresponding to a desired height dimension of an emitter electrode;

applying a first photo-mask composed of a first photo-sensitive lacquer onto select areas of said metal layer in a pattern corresponding to the desired shape of an emitter electrode and a control electrode and at least partially above said emitter and base zones;

applying a second photo-mask composed of a second photo-sensitive lacquer different from said first photo-sensitive lacquer and whose solvent does not dissolve said first photo-sensitive lacquer onto a select area of said metal layer in a pattern corresponding to the desired shape of an auxiliary emitter electrode and at least partially above said auxiliary emitter zone;

etching uncoated metal layer areas between said first and second photo-masks down to said surface of the semicondutor body;

removing said second photo-mask from said metal layer and etching the so-uncovered metal layer area above said auxiliary emitter zone to a height less than the metal layer areas masked by said first photo-mask and above said surface of the semiconductor body; and removing said first photo-mask from said metal layer and completing said thyristor structure.

3. A process as defined in claim 2 wherein said first and second photo-sensitive lacquers are selected from the group consisting of positive photo-sensitive lacquers and negative photo-sensitive lacquers.

4. A process as defined in claim 2 wherein said first photo-sensitive lacquer is a negative photo-sensitive lacquer and said second photo-sensitive lacquer is a positive photo-sensitive lacquer.

5. A process for producing a thyristor structure having a semiconductor body which includes a plane surface, an emitter zone at least partially covered by an emitter electrode, a base zone located adjacent said emitter zone and accessible at said plane surface of the semiconductor body, a control electrode having a plane surface in contact with said base zone, a contact electrode positioned on said emitter electrode and having a plane face above said plane surface of the semiconductor body and an auxiliary emitter zone positioned between said emitter electrode and said control electrode and accessible at said plane surface of the semiconductor body, said auxiliary emitter zone having an auxiliary emitter electrode in contact therewith, the steps comprising:

providing a semiconductor body having at least a plane upper surface, an emitter zone, a base zone and an auxiliary emitter zone therein which are spaced from one another and accessible at said plane upper surface of the semiconductor body;

depositing a metal layer on said plane surface of the semiconductor body in a thickness corresponding to a desired height dimension of an emitter electrode;

applying a first photo-mask onto select areas of said metal layer in a pattern leaving uncoated only an area thereof at least partially above said auxiliary emitter zone;

etching said uncoated metal layer area to produce a pit having a base below the upper surface of the coated metal layer areas and above said surface of the semiconductor body;

removing said first photo-mask from said metal layer and applying a second photo-mask onto the base of said pit and select areas of said metal layer in a pattern corresponding to the desired shape of an emitter electrode and a control electrode and at least partially above said emitter and base zones;

etching uncoated metal layer areas between metal layer areas coated by said second photo-mask down to said surface of the semiconductor body; and removing said second photo-mask from said metal layer and completing said thyristor structure.

* * * * *